(12) United States Patent
Kim

(10) Patent No.: US 8,946,760 B2
(45) Date of Patent: Feb. 3, 2015

(54) SEMICONDUCTOR LIGHT EMITTING DEVICE AND FABRICATION METHOD THEREOF

(71) Applicant: Samsung Electronics Co., Ltd., Suwon-si (KR)

(72) Inventor: Yu Seung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/803,943

(22) Filed: Mar. 14, 2013

(65) Prior Publication Data
US 2013/0256735 A1    Oct. 3, 2013

(30) Foreign Application Priority Data
Apr. 2, 2012    (KR) .................. 10-2012-0033978

(51) Int. Cl.
*H01L 33/00* (2010.01)
*H01L 33/62* (2010.01)
*H01L 33/44* (2010.01)
*H01L 33/38* (2010.01)

(52) U.S. Cl.
CPC ............... *H01L 33/62* (2013.01); *H01L 33/44* (2013.01); *H01L 33/382* (2013.01); *H01L 2224/24* (2013.01); *H01L 33/385* (2013.01)
USPC ........................................................ 257/99

(58) Field of Classification Search
CPC .......... H01L 33/62; H01L 33/44; H01L 33/00
USPC .......... 257/98, 99, 81, 82, 91, 100, 116, 117, 257/432–437
See application file for complete search history.

(56) References Cited

U.S. PATENT DOCUMENTS

| | | | |
|---|---|---|---|
| 8,471,241 B2 * | 6/2013 | Choi et al. | 257/13 |
| 8,735,932 B2 * | 5/2014 | Kim et al. | 257/99 |
| 2007/0176193 A1 * | 8/2007 | Nagai | 257/98 |
| 2010/0171135 A1 * | 7/2010 | Engl et al. | 257/98 |
| 2011/0233587 A1 | 9/2011 | Unno | |
| 2011/0300644 A1 * | 12/2011 | Akimoto et al. | 438/7 |

FOREIGN PATENT DOCUMENTS

| | | |
|---|---|---|
| JP | 2006-080316 | 3/2006 |
| KR | 1020100108907 | 10/2010 |
| KR | 1020110046007 | 5/2011 |

* cited by examiner

*Primary Examiner* — Armando Rodriguez
*Assistant Examiner* — Mohammed R Alam
(74) *Attorney, Agent, or Firm* — Onello & Mello, LLP

(57) ABSTRACT

A semiconductor light emitting device includes a substrate having first and second electrode patterns on at least one surface thereof, a light emitting structure on a surface of the substrate, a first electrode structure, a second electrode structure, an insulating layer, a first connection portion connecting the first electrode structure and the first electrode pattern, and a second connection portion connecting the second electrode structure extending outwardly from the light emitting structure and the second electrode pattern.

18 Claims, 8 Drawing Sheets

SEMICONDUCTOR LIGHT EMITTING DEVICE AND FABRICATION METHOD THEREOF

CROSS-REFERENCE TO RELATED APPLICATIONS

This application claims the priority of Korean Patent Application No. 10-2012-0033978 filed on Apr. 2, 2012, in the Korean Intellectual Property Office, the disclosure of which is incorporated herein by reference.

BACKGROUND

1. Field

Embodiments of the present inventive concepts relate to a semiconductor light emitting device and a fabrication method thereof.

2. Description of Related Art

Nitride semiconductors enjoy widespread use in connection with green or blue wavelength light emitting diodes (LED). They further are commonly used in laser diodes that are provided as a light source in full-color displays, image scanners, various signaling systems, or optical communications devices. LED devices of this type commonly include an active layer that emits light of various colors, including blue and green, through the recombination of electrons and holes.

As remarkable progress has been made in the area of nitride semiconductor light emitting devices since they were first developed, the utilization thereof has been greatly expanded and research into utilizing semiconductor light emitting devices for use in general illumination devices, as well as for light sources in electronic devices, has been actively undertaken. In particular, nitride light emitting devices have largely been used as components in low-current/low output mobile products, and recently, the utilization of nitride light emitting devices has extended into the field of high current/high output devices. As a result, research into improving the luminous efficiency and quality of semiconductor light emitting devices is active. In particular, light emitting devices having various electrode structures implemented to improve both optical power and reliability therein have been developed.

SUMMARY

In an aspect, the present inventive concepts provide a semiconductor light emitting device having improved reliability.

In another aspect, the present inventive concepts provide a semiconductor light emitting device and a method for fabricating a semiconductor light emitting device in which a light emitting structure and a substrate are stably and firmly coupled.

In another aspect, the present inventive concepts provide a semiconductor light emitting device having improved reliability.

In an aspect, a semiconductor light emitting device comprises: a substrate having first and second electrode patterns on at least one surface thereof; a light emitting structure on a surface of the substrate and including a first conductivity-type semiconductor layer, an active layer, and a second conductivity-type semiconductor layer; a first electrode structure electrically connected to the first conductivity-type semiconductor layer; a second electrode structure electrically connected to the second conductivity-type semiconductor layer, at least a portion of the second electrode structure positioned between the substrate and the light emitting structure, and extending to an outer side surface of the light emitting structure; an insulating layer between the substrate and the second electrode structure to separate the substrate and the second electrode structure; a first connection portion electrically connecting the first electrode structure and the first electrode pattern; and a second connection portion electrically connecting the second electrode structure and the second electrode pattern.

In some embodiments, the first electrode structure includes a conductive via penetrating, and insulated from, the second conductivity-type semiconductor layer and the active layer so as to be connected to the first conductivity-type semiconductor layer.

In some embodiments, the semiconductor light emitting device further comprises an insulator for insulating the conductive via from the second conductivity-type semiconductor layer and the active layer.

In some embodiments, the first electrode structure is positioned between the light emitting structure and the substrate and separated from the substrate by the insulating layer.

In some embodiments, the first electrode structure extends to an outer side surface of the light emitting structure between the light emitting structure and the substrate.

In some embodiments, the first connection portion is in contact with a portion of the first electrode structure extending outwardly from the light emitting structure and the first electrode pattern.

In some embodiments, the first electrode structure is positioned at a surface of the light emitting structure opposite a surface thereof at which the substrate is disposed.

In some embodiments, the first connection portion extends from the first electrode structure to a lateral surface of the light emitting structure so as to be in contact with the first electrode pattern.

In some embodiments, the semiconductor light emitting device further comprises an insulator for electrically insulating the first connection portion from the second conductivity-type semiconductor layer and the active layer.

In some embodiments, the substrate includes a substrate main body and a first and second vias penetrating the substrate main body in a vertical direction, relative to a horizontal direction of extension of the substrate, wherein the first and second vias are electrically connected to the first and second electrode patterns.

In some embodiments, the substrate further includes lower electrodes electrically connected to the plurality of vias on a surface thereof opposite the surface on which the first and second electrode patterns are positioned.

In another aspect, a method for fabricating a semiconductor light emitting device comprises: preparing a light emitting structure including a first conductivity-type semiconductor layer, an active layer, and a second conductivity-type semiconductor layer which are sequentially applied to a substrate for growth of semiconductor; forming first and second electrode structures electrically connected to the first and second conductivity-type semiconductor layers, respectively; preparing a substrate having first and second electrode patterns formed on at least one surface thereof; attaching the light emitting structure and the substrate by using an insulator interposed between a surface of the light emitting structure on which the second electrode structure is formed and a surface of the substrate on which the first and second electrode patterns are formed; removing the substrate for growth of semiconductor from the light emitting structure; removing portions of the light emitting structure and the insulator to expose at least portions of the first and second electrode patterns; and forming first and second connection portions electrically connecting the first and second electrode structures to the first and second electrode patterns, respectively.

In some embodiments, the forming of the first electrode includes forming a conductive via such that the conductive via penetrates, and is insulated from, the second conductivity-type semiconductor layer and the active layer so as to be connected to the first conductivity-type semiconductor layer.

In some embodiments, the removing of portions of the light emitting structure and the insulator to expose at least portions of the first and second electrode patterns includes removing at least a portion of the light emitting structure to separate the light emitting structure into an individual device unit, and removing a portion of the insulator to expose at least portions of the first and second electrode patterns.

In some embodiments, in the attaching of the light emitting structure to one surface of the substrate, the insulator is formed on at least one surface of the substrate and the light emitting structure by using a spin on glass (SOG) method.

The first connection portion may be formed to connect the exposed portion of the first electrode pattern and the first electrode structure.

In the attaching of the light emitting structure to one surface of the substrate, the insulator may have fluidity.

In the attaching of the light emitting structure to one surface of the substrate, the insulator may be formed on at least one surface of the substrate and the light emitting structure by using a spin on glass (SOG) method.

The forming of the first and second electrode structures may be performed separately.

The forming of the first electrode structure may be performed after the removing of the substrate for growth of semiconductor, and the first electrode structure may be formed on the first conductivity-type semiconductor layer exposed as the substrate for growth of semiconductor is removed.

The first connection portion may be formed to extend from the first electrode structure to a lateral surface of the light emitting structure so as to be in contact with the first electrode pattern.

The method may further include: forming an insulator for separating the first connection portion from the second conductivity-type semiconductor layer and the active layer.

In another aspect, a light emitting device comprises: a substrate having an upper surface, the substrate extending in a horizontal direction of extension; a light emitting structure having a lower layer, an intermediate layer, and an upper layer, the light emitting structure positioned on the substrate in a vertical direction relative to the horizontal direction; a first electrode structure electrically connected to the lower layer of the light emitting structure; a second electrode structure electrically connected to the upper layer of the light emitting structure; and an insulating layer positioned between the first electrode structure and the second electrode structure in the horizontal direction and positioned between the light emitting structure and the upper surface of the substrate in the vertical direction.

In some embodiments, the insulating layer insulates the first electrode structure from the second electrode structure and the insulating layer bonds the light emitting structure to the substrate.

In some embodiments, the substrate further comprises first and second electrode patterns at the upper surface thereof, and wherein the first and second electrode structures further comprise first and second connection portions that respectively electrically connect the first and second electrode patterns to the lower and upper layers of the light emitting structures.

In some embodiments, the second electrode structure further comprises a conductive via extending in the vertical direction along, and insulated from, the lower layer and intermediate layer of the light emitting structure.

In some embodiments, the second electrode structure further extends to an upper surface of the upper layer of the light emitting structure.

BRIEF DESCRIPTION OF THE DRAWINGS

The above and other aspects, features and other advantages of the inventive concepts will be more clearly understood from the following detailed description taken in conjunction with the accompanying drawings, in which.

DETAILED DESCRIPTION OF EMBODIMENTS

Figure 1:
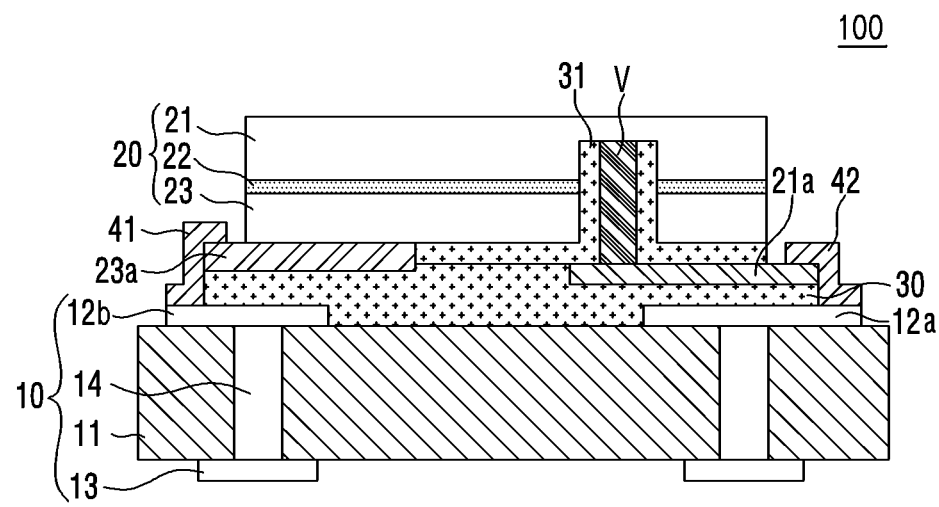
FIG. 1 is a cross-sectional view schematically illustrating a semiconductor light emitting device according to a first embodiment of the present inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view schematically illustrating a semiconductor light emitting device according to a first embodiment of the present inventive concepts.

With reference to FIG. 1, a semiconductor light emitting device 100 may include a substrate 10 on which first and second electrode patterns 12a and 12b are formed on at least one surface thereof, and a light emitting structure 20 disposed on the substrate 10. The light emitting structure 20 may include a first conductivity-type semiconductor layer 21, an active layer 22, and a second conductivity-type semiconductor layer 23. First and second electrode structures 21a and 23a electrically connected to the first and second conductivity-type semiconductor layers 21 and 23, respectively, may be formed on the light emitting structure 20.

The second electrode structure 23a is formed between the substrate 10 and the light emitting structure 20 and extends to the perimeter or to an external position of the light emitting structure 20. The first electrode structure 21a may be similarly formed An insulating layer 30 separating the second electrode structure 23a from the substrate 10 may be formed between the substrate 10 and the first electrode structure 21a and second electrode structure 23a. Meanwhile, the first and second electrode patterns 12a and 12b may be electrically connected to the first and second electrode structures 21a and 23a by first and second connection portions 41 and 42, respectively.

In some embodiments, the first and second electrode patterns 12a and 12b may be formed on an upper surface of the substrate 10. The light emitting structure 20 may also be disposed on the upper surface of the substrate and, optionally, disposed on the first and second electrode patterns 12a, 12b. Electrical signals are provided to the light emitting structure 20 through the first and second electrode patterns 12a and 12b.

In detail, the substrate 10 may include a substrate main body 11, the first and second electrode patterns 12a and 12b formed on one surface of the substrate main body 11, a plurality of vias 14 formed to penetrate the substrate main body 11 in a vertical direction, relative to a horizontal direction of extension of the substrate, and lower electrodes 13 provided on an opposite surface of the substrate main body 11. Here, the plurality of vias 14 may connect the first and second electrode patterns 12a and 12b and the lower electrodes 13 and may operate to dissipate heat generated by the light emitting structure 20 to an external location.

In some embodiments, the substrate main body 11 may comprise an organic resin material including one or more of epoxy, triazine, silicone, polyimide, or the like, or any other suitable organic resin materials. In other embodiments, the substrate main body 11 may comprise one or more of a ceramic material such as AlN, $Al_2O_3$, or the like, or a metal or a metal compound. In other embodiments, the substrate main body 11 may comprise a PCB substrate with an electrode pattern provided on a surface thereof.

In detail, the light emitting structure 20 may be provided on the surface on which the first and second electrode patterns 12a and 12g are positioned. A wiring structure and a separate power supply device (not shown) for supplying power to the light emitting structure 20 may be provided, or applied to, the lower electrodes at the lower surface of the substrate main body 11.

In FIG. 1, it is illustrated that the substrate 10 includes the vias 14 penetrating the substrate main body 11. However, the present inventive concepts are not limited thereto and any suitable substrate may be employed as the substrate 10 according to the present embodiment, especially those that include suitable wiring structures for driving the light emitting structure. In various embodiments, the electrodes 13 for accessing the wiring structures may be located on the bottom surface of the substrate or on the top surface of the substrate, so long as electrical access to the light emitting structure is provided thereby. In detail, wirings may be provided on an upper surface and a lower surface of the light emitting structure and electrically connected to the light emitting structure. In some embodiments, the wiring on the upper surface of the substrate main body 11 may be connected to the wiring on the lower surface of the substrate main body 11 through first and second connection portions 41 and 42 connected to the first and second electrode structures 21*a* and 23*a*.

In some embodiments, first and second electrode patterns 12*a* and 12*b* and the lower electrode 13 provided on the substrate main body 11 may be formed by plating a metal, e.g., gold (Au), copper (Cu), or the like, on the surface of the substrate main body 11, wherein the substrate includes a resin or a ceramic material.

In some embodiments, the light emitting structure 20 disposed on the substrate 10 may include first and second conductivity-type semiconductor layers 21 and 23 and an active layer 22 disposed therebetween.

In some embodiments, the first and second conductivity-type semiconductor layers 21 and 23 may comprise n-type and p-type semiconductor layers respectively and formed of nitride semiconductors, respectively. Thus, in the present embodiment, the first and second conductive types may be understood to denote an n-conductivity-type and a p-conductivity-type, respectively. In some embodiments, the first and second conductivity-type semiconductor layers 21 and 23 may have an empirical formula $Al_xIn_yGa_{(1-x-y)}N$ (Here, $0 \leq x \leq 1$, $0 \leq y \leq 1$, $0 \leq x+y \leq 1$), and may include, for example, a material such as GaN, AlGaN, InGaN, or the like.

The active layer 22 formed between the first and second conductive type semiconductor layers 21 and 23 may be formulated to emit light having a certain level of energy according to the recombination of electrons and holes, and may have a multi-quantum well (MQW) structure in which quantum well layers and quantum barrier layers are alternately laminated. As the MQW structure, for example, an InGaN/GaN structure may be used.

In some embodiments, the first and second electrodes 21*a* and 23*a* may be electrically connected to the first and second conductivity-type semiconductor layers 21 and 23, respectively, to apply external electrical signals to the light emitting structure 20.

Further, the first and second electrodes 21*a* and 23*a* operate to reflect light emitted from the active layer 22 to an upper portion of the light emitting structure 20, namely, toward the first conductivity-type semiconductor layer 21 and, in some embodiments, are in ohmic-contact with the first conductivity-type semiconductor layer 21. In consideration of this function, the first and second electrodes 21*a* and 23*a* may include a material such as silver (Ag), nickel (Ni), chromium (Cr), titanium (Ti), aluminum (Al), rhodium (Rh), palladium (Pd), iridium (Ir), ruthenium (Ru), magnesium (Mg), zinc (Zn), platinum (Pt), gold (Au), or other suitable material for this function. In this case, although not shown in detail, the first and second electrode structures 21*a* and 23*a* may comprise structures including two or more layers to enhance reflecting efficiency. For example, the structures may include Ni/Ag, Zn/Ag, Cr/Au, Cr/Al, Ti/Al, Ni/Al, Zn/Al, Pd/Ag, Pd/Al, Ir/Ag. Ir/Au, Pt/Ag, Pt/Al, Ni/Ag/Pt, and other suitable layers.

As illustrated in FIG. 1, the first and second electrode structures 21*a* and 23*a* may be positioned between the substrate 10 and the light emitting structure 20 and extend to an outer side region of the light emitting structure 20. The outer side regions of the first and second electrode structures 21*a* and 23*a* may be in contact with the first and second connection portions 41 and 42 so as to be electrically connected to the first and second electrode patterns 12*a* and 12*b*, respectively.

The first and second connection portions 41, 42 operate to electrically connect the first and second electrode structures 21*a* and 23*a* to the first and second electrode patterns 12*a* and 12*b*, respectively. In some embodiments, the first and second connection portions 41, 42 may comprise a metal or other suitable material having enhanced electrical conductivity.

In the embodiment depicted in FIG. 1, it is illustrated that the first and second electrode structures 21*a* and 23*a* both extend in an outward direction from the body of the light emitting structure 20 so as to be exposed to external regions. However, the present inventive concepts are not limited thereto and, in some embodiments, only one of the first and second electrode structures 21*a* and 23*a* extends to a region external to the light emitting structure 20. In some embodiments, the first and second connection portions 41, 42 may be positioned to completely cover the exposed surfaces of the first and second electrode structures 21*a* and 23*a*. In some embodiments, the first and second electrode structures 21*a* and 23*a* may be integrally formed with the first and second connection portions 41 and 42.

The second electrode structure 21*a* may include a conductive via V penetrating the second conductivity-type semiconductor layer 23 and the active layer 22 so as to be electrically connected to the first conductivity-type semiconductor layer 21. The second electrode structure 21*a* may further be at least partially laterally surrounded by an insulating layer 31 for insulating the conductive via V from the active layer 22 and the second conductivity-type semiconductor layer 23.

The conductive via V is connected to the first conductivity-type semiconductor layer 21, and the number, shape, and pitch of the conductive vias V, the contact area between the conductive via V and the material of the first conductivity-type semiconductor layer 21, and the like, may be appropriately selected to reduce contact resistance. In the present embodiment, the conductive via V is connected to the first conductivity-type semiconductor layer 21 within the body of the first conductivity-type semiconductor layer 21; however the present inventive concepts are not limited thereto. In some embodiments, the conductive via V may be configured to be connected to a surface of the first conductivity-type semiconductor layer 21 according to an embodiment. For example, the conductive via V can be connected to an upper surface, or a lower surface, of the first conductivity-type semiconductor layer 21

In the present embodiment, the conductive via V is connected to the first conductivity-type semiconductor layer 21 and extends vertically in a direction toward the substrate 10. The first electrode structure 21*a* including the conductive via V may be connected to the second connection portion 42 at the lateral side region of the light emitting structure 20. Thus, since the first and second electrode structures 21*a* and 23*a* are positioned between the light emitting structure 20, the opposite side of a main light emitting surface, and the substrate 10, a reduction in light extraction efficiency due to the presence of the light emitting structures is mitigated. Also, since the substrate 10 having excellent heat dissipation characteristics is applied, heat dissipation efficiency from the light emitting structure can be improved.

The insulating layer 30 may be positioned between the light emitting structure 20 and the substrate 10. The insulating layer 30 operates to isolate the first and second electrode structures 21*a* and 23*a* from each other and to securely couple the light emitting structure 20 to the substrate 10. Any of a number of suitable materials may be employed as the insulating layer 30, so long as the selected material has electrical insulation properties. At the same time, it is desired to select a material having reduced light absorption properties. In some example embodiments, silicon oxide or silicon nitride such as $SiO_2$, $SiO_xN_y$, $Si_xN_y$, etc. can be employed.

In general, during fabrication, when the first and second electrode structures 21a and 23a are melted so as to come in electrical contact with the first and second electrode patterns 12a and 12b of the substrate 10, materials constituting the first and second electrode structures 21a and 23a may come into contact with each other, thereby causing a defect to be present. Thus, in order to reduce the likelihood of, or outright prevent, the occurrence of this phenomenon, the first and second electrode structures 21a and 23a are positioned to be sufficiently spaced apart from one another. However fill material between the substrate 10 and the light emitting structure 20 may not be complete, as voids can be present, so bonding force may thus be degraded or the light emitting structure may otherwise be damaged as a result of an external impact.

However, in accordance with the present inventive concepts, in the present embodiment, since the insulating layer 30 is applied in the space between the light emitting structure and the substrate 10, shorting that can otherwise occur between the first and second electrode structures 21a and 23a when the first and second electrode structures 21a and 23a are melted to be bonded is mitigated or eliminated. Also, the light emitting structure 20 and the substrate 10 can be stably and firmly coupled to each other, as a result of the presence of the insulating layer 30.

Figure 2:
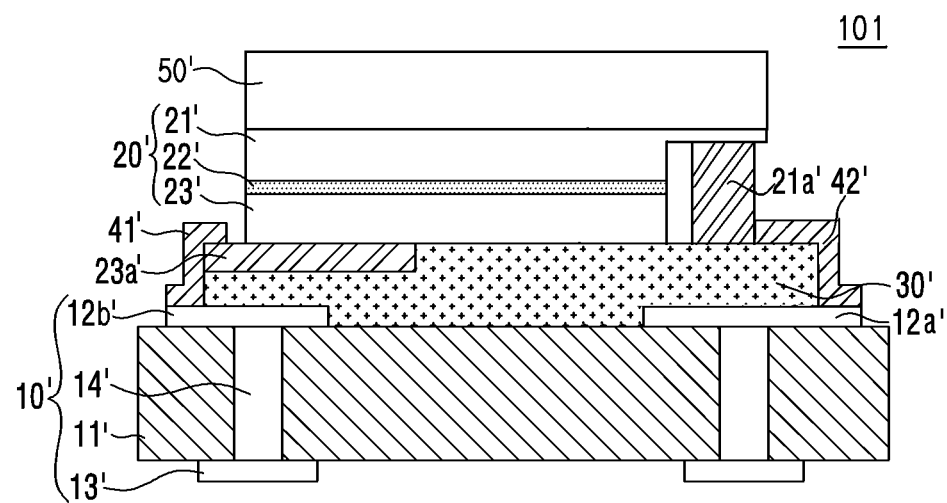
FIG. 2 is a cross-sectional view schematically illustrating a semiconductor light emitting device according to a modification of the first embodiment of the present inventive concepts.

FIG. 2 is a cross-sectional view schematically illustrating a semiconductor light emitting device according to a modification of the first embodiment of the present inventive concepts.

With reference to FIG. 2, a semiconductor light emitting device 101 according to the present embodiment is similar to the semiconductor light emitting device 100 illustrated in FIG. 1 in that the first and second electrode structures 21a and 23a are formed between a substrate 10' and a light emitting structure 20' and is different in that the first electrode structure 21a' does not include a conductive via V.

In detail, in the embodiment of FIG. 2, the first electrode structure 21a' may be positioned on a first conductivity-type semiconductor layer 21' exposed by etching portions of the second conductivity-type semiconductor layer 23', an active layer 22', and the first conductivity-type semiconductor layer 21' of the light emitting structure 20', and like the embodiment illustrated in FIG. 1, the first electrode structure 21a' may be connected to the first electrode pattern 12a' by means of a first connection portion 42'.

Also, in the present embodiment, the light emitting structure 20' is equipped with a substrate for growth of semiconductor 50' positioned thereon is attached to the substrate 10', having a structure similar to that of so-called flip-chip bonding.

However, the first and second electrode structures applicable to the present embodiment are not limited to the configuration illustrated in FIGS. 1 and 2 and may have various structures as necessary by having a conductive via and a metal connection portion.

In this FIG. 2 embodiment, it can be seen that the insulating layer 30' is positioned between the electrodes 21a', 23a' to prevent shorting therebetween. Also, the insulating layer 30' is positioned between the light emitting structure 20' and the substrate 10' to provide for suitable boding therebetween, as described above.

Figure 3:
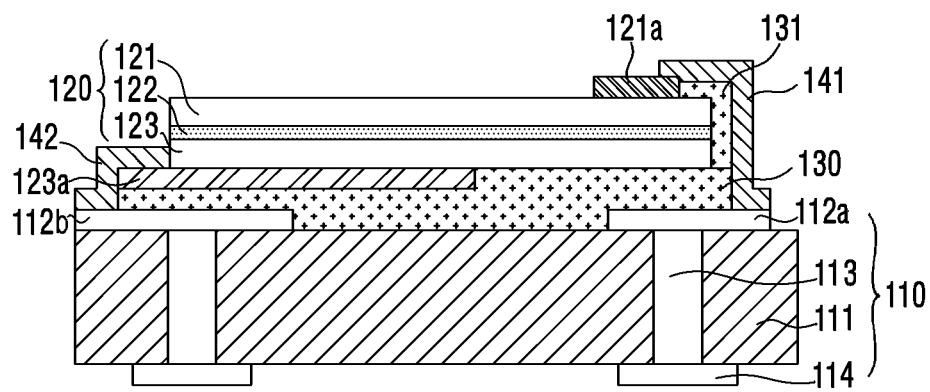
FIG. 3 is a cross-sectional view schematically illustrating a semiconductor light emitting device according to a second embodiment of the present inventive concepts.

FIG. 3 is a cross-sectional view schematically illustrating a semiconductor light emitting device according to a second embodiment of the present inventive concepts.

With reference to FIG. 3, a semiconductor light emitting device 200 includes a substrate 110 having first and second electrode patterns 112a and 112b formed on at least one surface thereof and a light emitting structure 120 disposed on the substrate 110. The light emitting structure 120 includes a first conductivity-type semiconductor layer 121, an active layer 122, and a second conductivity-type semiconductor layer 123. First and second electrode structures 121a and 123a may be formed on the light emitting structure 120 and electrically connected to the first and second conductivity-type semiconductor layers 121 and 123.

The second electrode structure 123a may be formed between the substrate 110 and the light emitting structure 120 and extend to a side region external to the light emitting structure 120. An insulating layer 130 may be formed between the substrate 110 and the second electrode structure 123a in order to separate the second electrode structure 123a from the substrate 110. Meanwhile, the first and second electrode patterns 112a and 112b positioned on the substrate 110 may be electrically connected to the first and second electrode structures 121a and 123a by first and second connection portions 141 and 142, respectively.

In the present embodiment, unlike the embodiments illustrated in FIGS. 1 and 2, the first electrode structure 121a is formed on an upper surface of the light emitting structure 120, providing a semiconductor light emitting device having a current flow that extends in a vertical direction relative to the horizontal direction of extension of the substrate.

In the semiconductor light emitting devices 100 and 101 according to the embodiments illustrated in FIGS. 1 and 2, the conductive via V is used or the light emitting structure 20 is mesa-etched and used, so all the first electrode structures 21a and 21a' and the second electrode structures 23a and 23a' are positioned generally between the substrates 10 and 10' and the light emitting structures 20 and 20', respectively. In the present embodiment, however, the first and second electrode structures 121a and 123a are positioned at opposite, lower and upper, surfaces of the light emitting structure 120.

In further detail, the first electrode structure 121a may be positioned on the first conductivity-type semiconductor layer 121 and may be connected to the first electrode pattern 112a by means of the first connection portion 141 extending across the lateral surface of the light emitting structure 120. In order to electrically separate the first connection portion 141 from the active layer 122 and the second conductivity-type semiconductor layer 123, the insulating layer 130 may be formed between the light emitting structure 120 and the substrate 110, and the light emitting structure 120 may be thereby stably coupled to the substrate 110 as a result of the presence to the insulating layer 130. As described here, any suitable material may be employed as the insulating layer 130 as long as it has electrical insulation properties.

In the present embodiment, since the first and second electrode structures 121a, 123a are formed on upper and lower surfaces of the light emitting structure 120, current flow in the vertical direction can be improved and since a process for forming a conductive via is omitted, device fabrication processes can be simplified. Also, since the active layer 122, a light emitting region, is not partially removed, the overall light emitting area of the device can be maximized. In addition, since only the second electrode structure 123a is formed between the light emitting structure 120 and the substrate 110, the degree of freedom in designing the shape and size of the second electrode structures 123a can be increased.

In this FIG. 3 embodiment, it can be seen that the insulating layer 130 is positioned between the first connection portion 141 and the second 123a to prevent shorting therebetween.

Also, the insulating layer 130 is positioned between the light emitting structure 120 and the substrate 110 to provide for suitable boding therebetween, as described herein.

Figure 4:
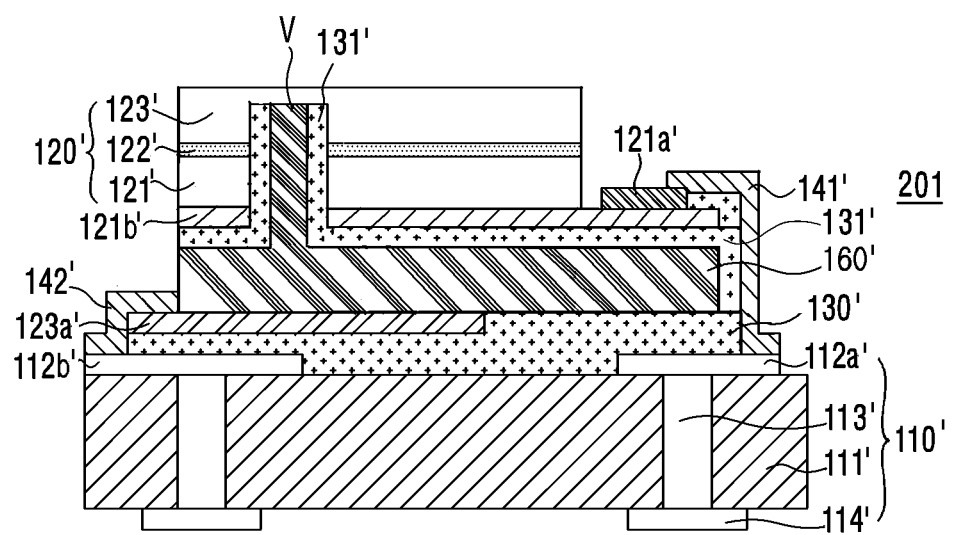
FIG. 4 is a cross-sectional view schematically illustrating a semiconductor light emitting device according to a modification of the second embodiment of the present inventive concepts.

FIG. 4 is a cross-sectional view schematically illustrating a semiconductor light emitting device according to a modification of the second embodiment of the present inventive concepts.

With reference to FIG. 4, a semiconductor light emitting device 201 according to the present embodiment includes a substrate 110' having first and second electrode patterns 112a' and 112b' formed on at least one surface thereof, and a light emitting structure 120' disposed on the substrate 110'. The light emitting structure 120' includes a first conductivity-type semiconductor layer 121', an active layer 122', and a second conductivity-type semiconductor layer 123'. First and second electrode structures 121a' and 123a' may be formed on the light emitting structure 120' and electrically connected to the first and second conductivity-type semiconductor layers 121'; and 123'.

The present embodiment is similar to the semiconductor light emitting device 200 illustrated in FIG. 3 in that the first and second conductivity-type semiconductor layers 121', 123' are formed on different layers of the device in the vertical direction. The present embodiment is different in that the semiconductor light emitting device further includes a conductive substrate 160' formed between the light emitting structure 120' and the substrate 110', a conductive via V, and a conductivity-type contact layer 121b' connected to the first electrode structure 121a'.

In further detail, the conductive substrate 160' operates as a support for supporting the light emitting structure during a process such as a laser lift-off process, or the like, and may comprise a material including one or more of gold (Au), nickel (Ni), aluminum (Al), copper (Cu), tungsten (W), silicone (Si), selenium (Se), and gallium arsenide (GaAs), or other suitable substrate material. For example, the conductive substrate 160' may comprise a material obtained by doping aluminum (Al) in silicone (Si). In this case, the conductive substrate 160' may be formed through a method such as plating, bonding, or the like, according to a selected material.

Thus, in the present embodiment, the first and second conductivity-type semiconductor layers 121' and 123' may be understood as a p-type semiconductor layer and an n-type semiconductor layer, respectively, but the present inventive concepts are not limited thereto.

The conductive substrate 160' is electrically connected to the second conductivity-type semiconductor layer 123', and accordingly, the conductive substrate 160' may serve as an electrode through which an electrical signal can be applied to the second conductivity-type semiconductor layer 123'. To this end, as shown in FIG. 4, a conductive via V extending from the conductive substrate 160' so as to be connected to the second conductivity-type semiconductor layer 123' may be provided, and the first electrode structure 123a' may be integrally formed with the conductive substrate 160'.

In the present embodiment, the number, shape, and pitch of the conductive vias V, and the contact area between the conductive via V and the second conductivity-type semiconductor layer 123' may be appropriately configured, and the conductive via V and the conductive substrate 160' may also be integrally formed. An insulator 131' may be interposed between the conductive via V and the light emitting structure 120' in order to electrically separate the conductive via V from the active layer 122' and the first conductivity-type semiconductor layer 121'.

Meanwhile, the conductivity-type contact layer 121b' may be formed between the light emitting structure 120' and the substrate 110' and may operate to reflect light emitted from the active layer 122' toward the second conductivity-type semiconductor layer 123'. The conductivity-type contact layer 121b' is electrically separated from the conductive substrate 160', and to this end, the insulating layer 131' may be interposed between the conductivity-type contact layer 121b' and the conductive substrate 160'. The insulator 131' may be further interposed between a sidewall of the conductive substrate 160' and the first connection portion 141'.

FIGS. 5 through 9 are cross-sectional views illustrating a semiconductor light emitting device according to an embodiment of the present inventive concepts, which, specifically, correspond to processes for fabricating the semiconductor light emitting device 100 having the structure illustrated in FIG. 1.

In FIGS. 5 through 9, the processes are illustrated based on a single semiconductor light emitting device having the first and second electrode structures; however, the present inventive concepts are not limited thereto. The present inventive concepts may also be applied to a process of fabricating a plurality of device unit light emitting devices at a wafer level.

The method of fabricating a semiconductor light emitting device according to the present embodiment may include forming the light emitting structure 20 on the substrate for growth of semiconductor 50, forming the first and second electrode structures 21a and 23a on the light emitting structure 20, attaching the light emitting structure 20 to a substrate having the first and second electrode patterns 12a and 12b, removing the substrate for growth of semiconductor 50 from the light emitting structure 20, removing a portion of the light emitting structure 20 to expose the second electrode pattern 12b, and forming the first and second connection portions 41 and 42 connecting the first and second electrode patterns 12a and 12b and the first and second electrode structures 21a and 23a, respectively.

Figure 5:
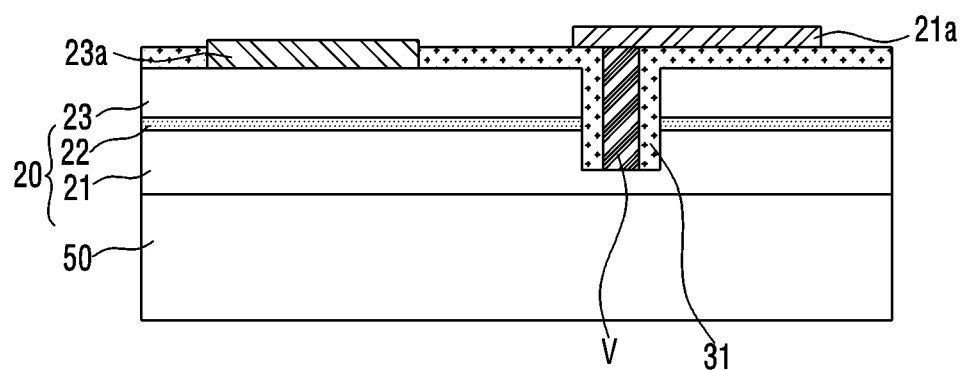
FIGS. 5 through 9 are cross-sectional views illustrating a semiconductor light emitting device according to an embodiment of the present inventive concepts.

First, as shown in FIG. 5, the first conductivity-type semiconductor layer 21, the active layer 22, and the second conductivity-type semiconductor layer 23 may be sequentially provided on the substrate for growth of semiconductor 50 by using a semiconductor layer growth process such as metal organic chemical vapor deposition (MOCVD), hydride vapor phase epitaxy (HVPE), molecular beam epitaxy (MBE), or the like, to form the light emitting structure 20. For example, the light emitting structure 20 may comprise a nitride-based semiconductor having a composition of $Al_xIn_yGa_{(1-x-y)}N$ ($0 \le x \le 1$, $0 \le y \le 1$, $0 \le x+y \le 1$).

As the substrate for growth of semiconductor 50, a substrate comprising a material such as SiC, $MgAl_2O_4$, MgO, $LiAlO_2$, $LiGaO_2$, GaN, or the like, or combination of these, may be employed. In this case, sapphire is a crystal having Hexa-Rhombo R3c symmetry, of which lattice constants in the c-axis and a-axis directions are 13.001 Å and 4.758 Å, respectively. The sapphire crystal has a C plane (0001), an A plane (1120), an R plane (1102), and the like. In this case, a nitride thin film can be relatively easily formed on the C plane of the sapphire crystal and because sapphire crystal is stable at high temperatures, sapphire crystal is commonly used as a material for a nitride growth substrate. Although not shown, a buffer layer may be formed between the light emitting structure 20 and the substrate for growth of semiconductor 50, and the buffer layer may be employed as an undoped semiconductor layer made of a nitride, or the like, to alleviate a lattice defect in the light emitting structure grown thereon.

The first and second electrode structures 21a and 23a may be formed on the light emitting structure 20 and electrically connected to the first and second conductivity-type semiconductor layers 21 and 23, respectively. The first and second electrode structures 21a and 23a may be formed in the same direction on the light emitting structure 20. The first and second electrode structures 21a and 23a may be formed to include a material such as silver (Ag), nickel (Ni), chromium (Cr), titanium (Ti), aluminum (Al), rhodium (Rh), palladium (Pd), iridium (Ir), ruthenium (Ru), magnesium (Mg), zinc (Zn), platinum (Pt), gold (Au), or the like, in consideration of a light reflecting function and an ohmic-contact function with the semiconductor layers, and in this case, a process such as sputtering, deposition, or the like, known in the art may be appropriately used.

Although not shown in detail, the first and second electrode structures 21a and 23a may be include two or more layers to enhance reflecting efficiency. For example, the structures may include Ni/Ag, Zn/Ag, Cr/Au, Cr/Al, Ti/Al, Ni/Al, Zn/Al, Pd/Ag, Pd/Al, Ir/Ag. Ir/Au, Pt/Ag, Pt/Al, Ni/Ag/Pt, and the like.

The first electrode structure 21a may include a conductive via V penetrating the second conductivity-type semiconductor layer 23 and the active layer 22 so as to be connected to the first conductivity-type semiconductor layer 21. The conductive via V may be formed by removing a portion of the light emitting structure 20 and filling the interior of a recess formed according to the removal of a portion of the light emitting structure 20 with a conductive material, e.g., a material including any one of titanium (Ti), TiW, gold (Au), nickel (Ni), aluminum (Al), copper (Cu), tungsten (W), silicone (Si), selenium (Se), and gallium arsenide (GaAs). Here, process such as plating, sputtering, deposition, or the like, may be used, and the number, shape, pitch, or the like, of the conductive vias V may be appropriately adjusted as necessary.

In order to electrically separate the first electrode structure 21a including the conductive via V from the active layer 22 and the second conductivity-type semiconductor layer 23, the insulating layer 31 may be interposed therebetween, and the insulating layer 31 may be formed by depositing a material such as $SiO_2$, $SiO_xN_y$, $Si_xN_y$, or the like, on the surface of the light emitting structure 20.

Figure 6:
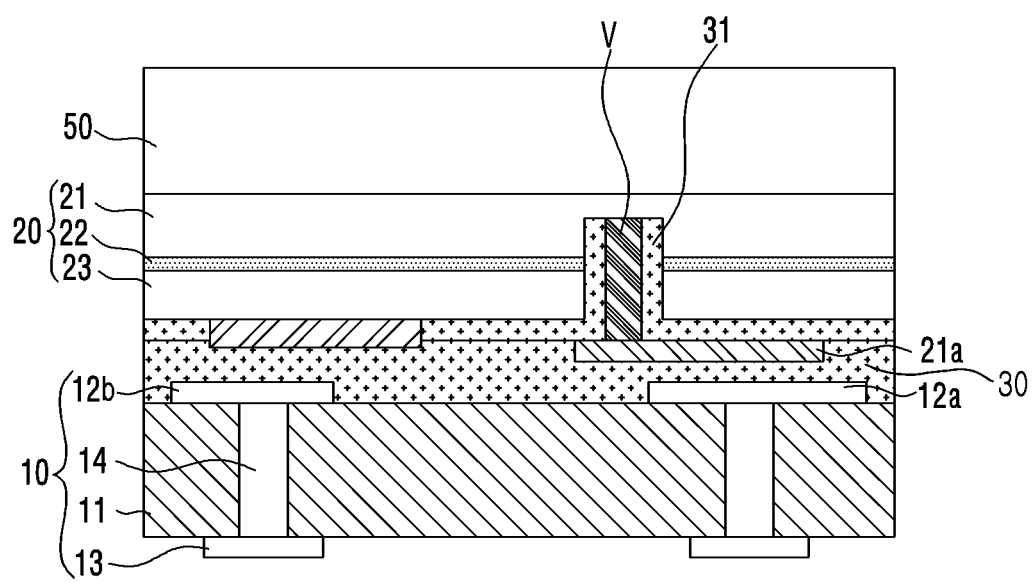

Next, as shown in FIG. 6, the light emitting structure 20 may be applied to the substrate 10 by using the insulating layer 30. The substrate 10 may include the first and second electrode patterns 12a and 12b formed on at least one surface thereof, and the light emitting structure 20 may be disposed such that the surface thereof on which the second electrodes 21a and 23a are formed faces the substrate 10.

The substrate 10 may include may include a substrate main body 11, the first and second electrode patterns 12a and 12b formed on the upper surface of the substrate main body 11, a plurality of vias 14 formed to penetrate the substrate main body 11 in a thickness direction, and a lower electrode 13 formed on the lower surface of the substrate main body 11. However, the shape of the substrate 10 is not limited thereto and any substrate may be used as the substrate 10 according to the present embodiment. The substrate can include wiring structures for driving the light emitting structure, formed on one or more of the surface on which the light emitting structure 20 is disposed and on the surface opposed thereto.

In the present embodiment, the light emitting structure 20, in a state in which the surface on which the second electrode structure 23a is formed faces the first and second electrode patterns 12a and 12b of the substrate 10, may be fixed to the substrate 10 by the insulating layer 30 interposed between the light emitting structure 20 and the substrate 10.

The insulating layer 30 may electrically separate the first and second electrode structures 21a and 23a and stably couple the light emitting structure 20 and the substrate 10, as described herein. Any suitable insulative material may be employed as the insulating layer 30. Minimization of light absorption is also a desired property for the insulating layer 30. In various example embodiments, silicon oxide or silicon nitride such as $SiO_2$, $SiO_xN_y$, $Si_xN_y$, etc., may be employed.

In some embodiments, the insulating layer 30 may be formed by using various known methods such as a deposition, spin on glass (SOG), coating, and the like, on at least one surface of the light emitting structure 20 and the substrate 10. For example, the light emitting structure 20 and the substrate 10 may be attached through a process of applying a fluid resin to a surface of the substrate 10 or the light emitting structure 20 and then curing the same, or a resin is applied to the surfaces of the light emitting structure 20 and the substrate, and then, in a state in which the resin is cured, the surfaces on which the resin is formed are brought into contact and heat and pressure are applied thereto, thus coupling the resin.

Accordingly, the first and second electrode structures 21a and 23a formed on the light emitting structure 20 may be separated from the first and second electrode patterns 12a and 12b of the substrate 10 by the insulating layer 30.

In general, in conventional approached whereby the light emitting structure 20 is fixed to the substrate 10 by bringing the first and second electrode structures 21a and 23a into contact with the first and second electrode patterns 12a and 12b and by melting them, the melted first and second electrode structures 21a and 23a are made to inadvertently contact each other to thereby cause a shorting defect. Thus, in an effort to prevent an occurrence of this phenomenon, the first and second electrode structures 21a and 23a may be disposed to be spaced apart from one another. As a result however, the contact area between the light emitting structure 20 and the substrate 10 is reduced, thereby weakening the bonding force between the light emitting structure and the substrate 10 in the conventional approaches.

However, in embodiments in accordance with the present inventive concepts, since the light emitting structure and the substrate 10 are coupled by using the insulating layer 30, rather than being coupled by the medium of the first and second electrode structures 21a and 23a, the foregoing problems can be solved to thus provide a semiconductor light emitting device having improved adherence, and therefore, improved reliability. In detail, in the method for fabricating a semiconductor light emitting device according to the present inventive concepts, the first and second electrode structures 21a and 23a are electrically separated by using the insulating layer 30 and the insulating layer 30 is used as an bonding material, whereby the substrate 10 and the light emitting structure 20 can be stably and firmly coupled.

Figure 7:
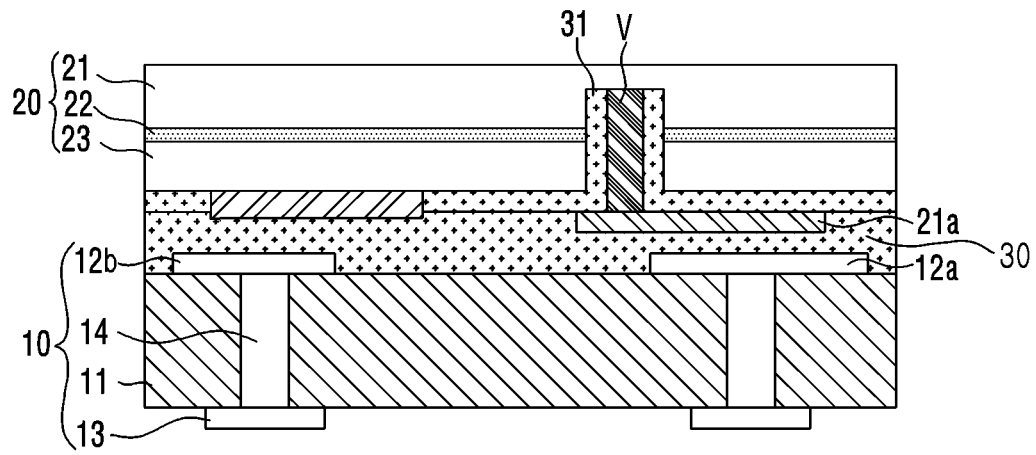

Thereafter, as shown in FIG. 7, the substrate for growth of semiconductor 50 may be removed from the light emitting structure 20 with the substrate 10 attached thereto. Here, the substrate 10 may serve as a support substrate in removing the substrate for growth of semiconductor 50. The substrate for growth of semiconductor 50 may be removed through a process such as a laser lift-off process, a chemical lift-off process, or the like.

Figure 8:
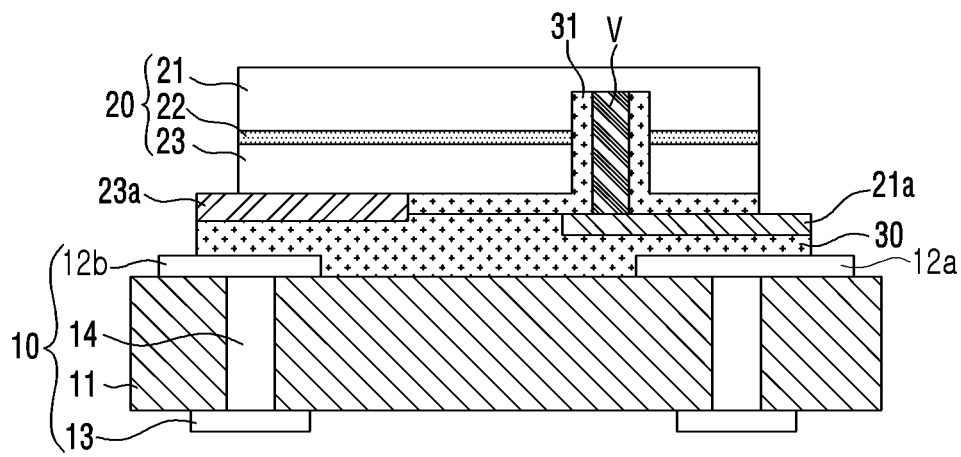

Thereafter, as shown in FIG. 8, portions of the light emitting structure 20 and the insulating layer 30 are removed to expose at least a portion of the first and second electrode patterns 12a and 12b. The process of removing portions of the light emitting structure 20 and the insulating layer 30 may be simultaneously performed or separately sequentially performed by using an etching process known in the art, e.g., inductively coupled plasma-ion reactive etching (ICP-RIE), or the like. The regions of the first and second electrode patterns 12a and 12b exposed through the etching process may be provided as electrical connection portions with the first and second conductivity-type semiconductor layers 21 and 23 later.

Meanwhile, when this process is performed on a wafer level, the process of removing a portion of the light emitting structure 20 may be simultaneously performed with a process of dicing or partitioning the light emitting structure 20 into individual device units or diced multiple device units.

Figure 9:
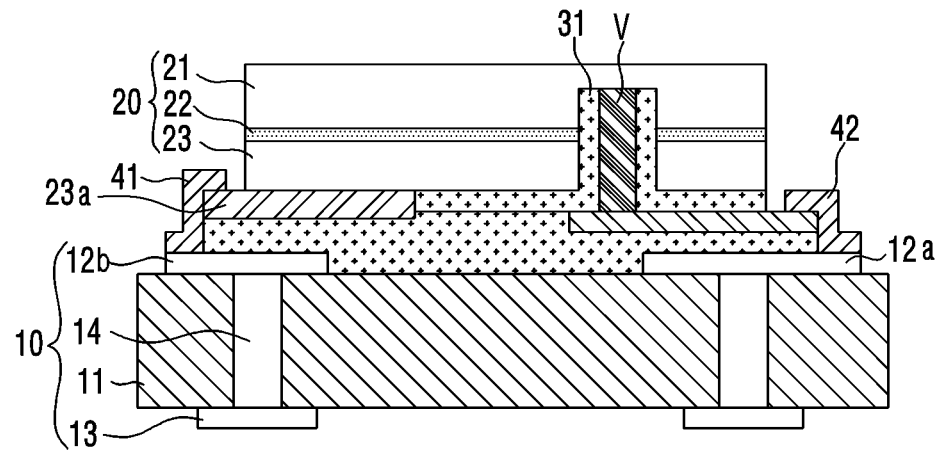

Then, as shown in FIG. 9, the first and second connection portions 41 and 42 may be formed to connect the exposed first and second electrode patterns 12a and 12b and exposed first and second electrode structures 21a and 23a, respectively.

The first and second connection portions 41 and 42 may be formed to extend to the first and second electrode structures 21a and 23a from the exposed regions of the first and second electrode patterns 12a and 12b. In detail, the first and second connection portions 41 and 42 may be in contact with the first and second electrode structures 21a and 23a extending outwardly from the light emitting structure 20 so as to be exposed and apply an electrical signal to the light emitting structure 20 through the substrate 10. To this end, the first and second connection portions comprise a conductive material such as a metal having excellent electrical conductivity and may be formed by using a known method such as plating, deposition, or the like.

FIGS. 10 through 15 are cross-sectional views illustrating a semiconductor light emitting device according to an embodiment of the present inventive concepts, which, specifically, correspond to processes for fabricating the semiconductor light emitting device 200 having the structure illustrated in FIG. 3.

Like the former embodiment, in FIGS. 10 through 15, the processes are illustrated based on a single semiconductor light emitting device having the first and second electrode structures, but the present inventive concepts are not limited thereto. The present inventive concepts may also be applied to a process of fabricating a plurality of device unit light emitting devices on a wafer level.

The method of fabricating a semiconductor light emitting device according to the present embodiment may include forming the light emitting structure 120 on the substrate for growth of semiconductor 150, forming the first and second electrode structures 121a and 123a on the light emitting structure 120, attaching the light emitting structure 120 to a substrate 110 having the first and second electrode patterns 112a and 112b by using the insulating layer 130, removing the substrate for growth of semiconductor 150 from the light emitting structure 120, removing portions of the light emitting structure 120 and the insulating layer 130 to expose at least portions of the first and second electrode patterns 112a and 112b, and forming the first and second connection portions 141 and 142 connecting the first and second electrode patterns 112a and 112b and the first and second electrode structures 121a and 123a, respectively.

Figure 10:
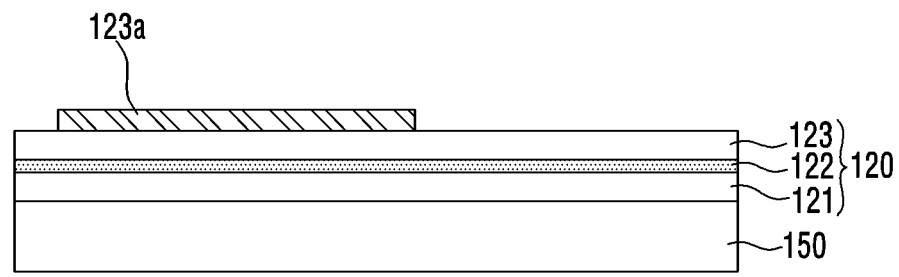
FIGS. 10 through 15 are cross-sectional views illustrating a semiconductor light emitting device according to an embodiment of the present inventive concepts.

First, as shown in FIG. 10, the first conductivity-type semiconductor layer 121, the active layer 122, and the second conductivity-type semiconductor layer 123 may be sequentially grown on the substrate for growth of semiconductor 150 to form the light emitting structure 120. As the substrate for growth of semiconductor 150, a substrate comprising a material such as sapphire, SiC, $MgAl_2O_4$, MgO, $LiAlO_2$, $LiGaO_2$, GaN, or the like, may be used, and the light emitting structure 120 may be grown on the substrate for growth of semiconductor 150 by using a semiconductor layer growth process such as metal organic chemical vapor deposition (MOCVD), hydride vapor phase epitaxy (HVPE), molecular beam epitaxy (MBE), or the like.

The second electrode structure 123a may be formed on an upper surface of the light emitting structure 120 and electrically connected to the second conductivity-type semiconductor layer 123. In consideration of a light reflecting function and an ohmic-contact function with the semiconductor layer 123, the second electrode structure 123a may be formed to include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, or other suitable material. In this case, a process such as sputtering, deposition, or the like, as known in the art may be appropriately used.

Figure 11:
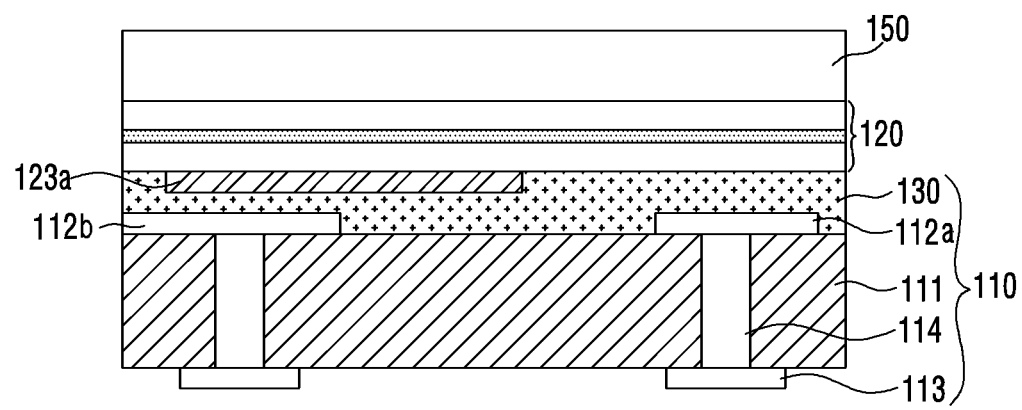

Next, as shown in FIG. 11, the light emitting structure 120 may be attached to the substrate 110 by using the insulating layer 130. The substrate 110 may include the first and second electrode patterns 112a and 112b formed on one surface thereof, and the first and second electrode patterns 112a and 112b may be connected to lower electrodes 113 by means of conductive vias 114 penetrating a substrate main body 111 in a thickness direction. The light emitting structure 120 may be disposed such that the surface thereof on which the second electrode structure 123a is formed faces the substrate 110, and the second electrode structure 123a may be separated from the second electrode pattern 112b of the substrate 110 by the insulating layer 130.

Figure 12:
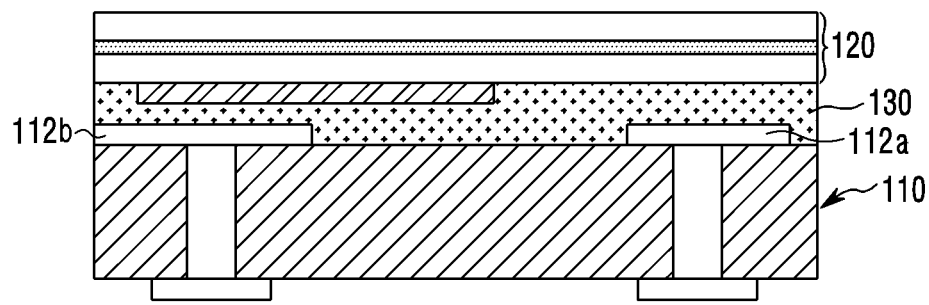

Thereafter, as shown in FIG. 12, the substrate for growth of semiconductor 150 may be removed from the light emitting structure 120 with the substrate 110 attached thereto. Here, the substrate for growth of semiconductor 50 may be removed through a chemical lift-off process or a laser lift-off process using the substrate 110 as a support.

Figure 13:
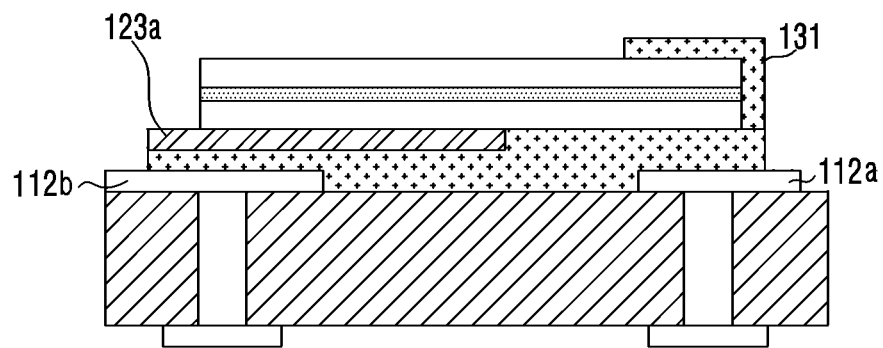

Thereafter, as shown in FIG. 13, portions of the light emitting structure 120 and the insulating layer 130 are removed to expose at least portions of the first and second electrode patterns 112a and 112b. As described above in the former embodiment, the process of removing the portions of the light emitting structure 120 and the insulating layer 130 may be simultaneously performed during a process of severing the light emitting structure into an individual device unit on the wafer level.

Meanwhile, the insulator 131 may be formed in a region in which a first connection portion (not shown) for connecting the first electrode structure (not shown) and the first electrode pattern 112a is to be formed. The insulator may be formed on portions of a lateral surface and an upper surface of the light emitting structure 120. The insulator 131 serves to electrically separate the first connection portion from the second conductivity-type semiconductor layer 123 and the active layer 122 and, unlike the configuration as shown in FIG. 13, the insulator 131 may be formed to cover only the lateral surface of the light emitting structure 120.

Figure 14:
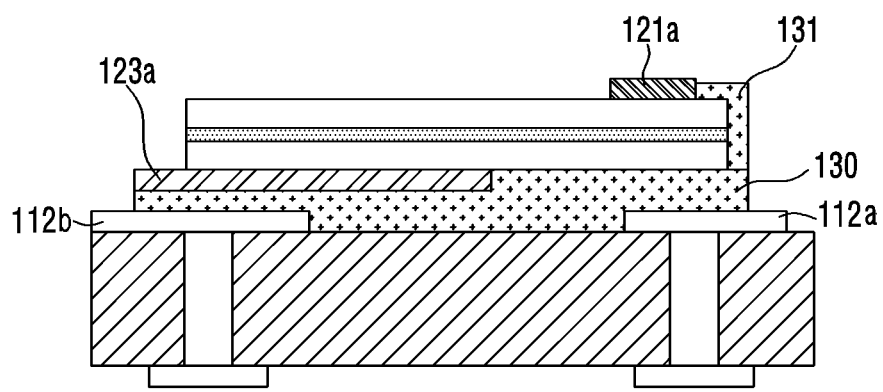

Thereafter, as shown in FIG. 14, the first electrode structure 121a may be formed on the first conductivity-type semiconductor layer 121. The first electrode structure 121a may serve as an electrode pad for applying external electric signal to the first conductivity-type semiconductor layer 121.

Figure 15:
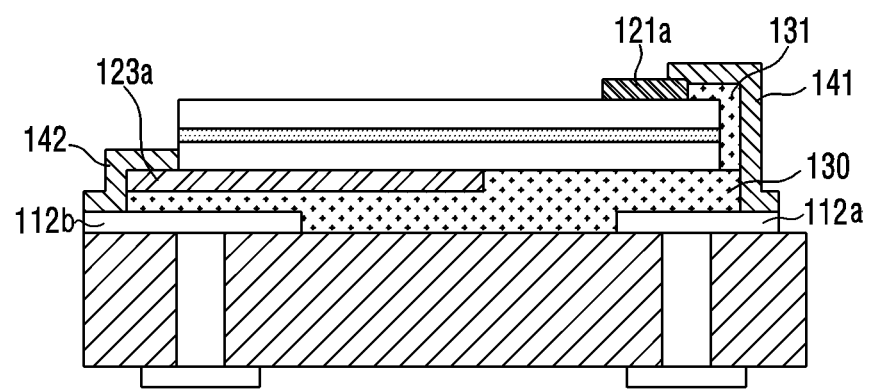

To this end, as shown in FIG. 15, the first connection portion 141 extending from the first electrode pad 112a to the lateral surface of the light emitting structure 120 so as to be connected to the first electrode structure 121a and the second connection portion 142 connecting the second electrode structure 123a and the second electrode pattern 112b may be formed. Accordingly, the first and second electrode structures 121a and 123a electrically connected to the first and second conductivity-type semiconductor layers 121 and 123, respectively, may be connected to the first and second electrode patterns 112a and 112b of the substrate 110 by means of the first and second connection portions 141 and 142 to thus receive an external signal.

In the case of the method for fabricating a semiconductor light emitting device according to the present embodiment, the substrates 10 and 110 and the light emitting structures 20 and 120 can be stably and firmly coupled by using the insulators 30 and 130 as a bonding material for coupling the light emitting structures 20 and 120 and the substrates 10 and 110 through a simple process. Also, the possibility of generating a short between the electrodes is mitigated or eliminated. Also, since the light emitting structure can be firmly coupled with the light emitting device mounting structure, a semiconductor light emitting device having improved reliability can be provided.

As set forth above, according to embodiments of the inventive concepts, a semiconductor light emitting device having improved reliability can be provided.

In addition, a method for fabricating a semiconductor light emitting device allowing a light emitting structure and a substrate to be stably and firmly coupled can be provided.

While the present inventive concepts have been shown and described in connection with the embodiments, it will be apparent to those skilled in the art that modifications and variations can be made without departing from the spirit and scope of the inventive concepts as defined by the appended claims.

What is claimed is:

1. A semiconductor light emitting device comprising:
   a substrate having first and second electrode patterns on at least one surface thereof;
   a light emitting structure on a surface of the substrate and including a first conductivity-type semiconductor layer, an active layer, and a second conductivity-type semiconductor layer;
   a first electrode structure electrically connected to the first conductivity-type semiconductor layer;
   a second electrode structure electrically connected to the second conductivity-type semiconductor layer, at least a portion of the second electrode structure positioned between the substrate and the light emitting structure, and having an extending portion extending to an outer side surface of the light emitting structure;
   an insulating layer between the substrate and the second electrode structure to separate the substrate and the second electrode structure;
   a first connection portion electrically connecting the first electrode structure and the first electrode pattern; and
   a second connection portion in contact with the extending portion of the second electrode structure and the second electrode pattern of the substrate, respectively, such that the second connection portion forms an electrical connection between the second electrode structure and the second electrode pattern.

2. The semiconductor light emitting device of claim 1, wherein the first electrode structure includes a conductive via penetrating, and insulated from, the second conductivity-type semiconductor layer and the active layer so as to be connected to the first conductivity-type semiconductor layer.

3. The semiconductor light emitting device of claim 2, further comprising an insulator for insulating the conductive via from the second conductivity-type semiconductor layer and the active layer.

4. The semiconductor light emitting device of claim 1, wherein the first electrode structure is positioned between the light emitting structure and the substrate and separated from the substrate by the insulating layer.

5. The semiconductor light emitting device of claim 4, wherein the first electrode structure extends to an outer side surface of the light emitting structure between the light emitting structure and the substrate.

6. The semiconductor light emitting device of claim 5, wherein the first connection portion is in contact with a portion of the first electrode structure extending outwardly from the light emitting structure and the first electrode pattern.

7. The semiconductor light emitting device of claim 1, wherein the first electrode structure is positioned at a surface of the light emitting structure opposite a surface thereof at which the substrate is disposed.

8. The semiconductor light emitting device of claim 7, wherein the first connection portion extends from the first electrode structure to a lateral surface of the light emitting structure so as to be in contact with the first electrode pattern.

9. The semiconductor light emitting device of claim 8, further comprising an insulator for electrically insulating the first connection portion from the second conductivity-type semiconductor layer and the active layer.

10. The semiconductor light emitting device of claim 1, wherein the substrate includes a substrate main body and a first and second vias penetrating the substrate main body in a vertical direction, relative to a horizontal direction of extension of the substrate, wherein the first and second vias are electrically connected to the first and second electrode patterns.

11. The semiconductor light emitting device of claim 10, wherein the substrate further includes lower electrodes electrically connected to the first and second vias on a surface thereof opposite the surface on which the first and second electrode patterns are positioned.

12. A light emitting device comprising:
   a substrate having an upper surface, the substrate extending in a horizontal direction of extension, the substrate having first and second electrode patterns on the upper surface;
   a light emitting structure having a lower layer, an intermediate layer, and an upper layer, the light emitting structure positioned on the substrate in a vertical direction relative to the horizontal direction;
   a first electrode structure electrically connected to the lower layer of the light emitting structure;
   a second electrode structure electrically connected to the upper layer of the light emitting structure;
   an insulating layer positioned between the first electrode structure and the second electrode structure in the horizontal direction and positioned between the light emitting structure and the upper surface of the substrate in the vertical direction, wherein the insulating layer is disposed between the second electrode structure and the second electrode pattern of the substrate such that the second electrode structure and the second electrode pattern are connected in a region outside of a region between the light emitting structure and the substrate;
   a first connection portion electrically connecting the first electrode structure and the first electrode pattern; and
   a second connection portion electrically connecting the second electrode structure and the second electrode pattern.

13. The light emitting device of claim 12 wherein the insulating layer insulates the first electrode structure from the second electrode structure and wherein the insulating layer bonds the light emitting structure to the substrate.

14. The light emitting device of claim 12 wherein the second electrode structure further comprises a conductive via extending in the vertical direction along, and insulated from, the lower layer and intermediate layer of the light emitting structure.

15. The light emitting device of claim 12 wherein the second electrode structure further extends to an upper surface of the upper layer of the light emitting structure.

16. The semiconductor light emitting device of claim 1, wherein the second connection portion is disposed on a region of the second electrode pattern of the substrate outside of a region between the light emitting structure and the second electrode pattern of the substrate.

17. The semiconductor light emitting device of claim 1, wherein the insulating layer is disposed between the second electrode pattern of the substrate and the second electrode structure to separate the second electrode pattern and the second electrode structure.

18. The semiconductor light emitting device of claim 1, wherein the second connection portion contacts a top surface of the second electrode structure and a top surface of the second electrode pattern.

* * * * *